United States Patent
Shimoji et al.

(10) Patent No.: US 7,687,704 B2
(45) Date of Patent: Mar. 30, 2010

(54) THERMOELECTRIC GENERATOR FOR INTERNAL COMBUSTION ENGINE

(75) Inventors: Kouji Shimoji, Okazaki (JP); Kouichi Suzuki, Toyoake (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 11/049,644

(22) Filed: Feb. 4, 2005

(65) Prior Publication Data

US 2005/0172992 A1    Aug. 11, 2005

(30) Foreign Application Priority Data

Feb. 5, 2004    (JP)    ............... 2004-029335

(51) Int. Cl.
*H01L 35/30*    (2006.01)
(52) U.S. Cl. ............... 136/205; 136/208; 422/174; 422/109; 422/173; 422/177; 422/180; 422/199; 422/202; 60/298
(58) Field of Classification Search ............. 136/205, 136/208; 422/174, 109, 173, 177, 180, 199, 422/202; 60/298
See application file for complete search history.

(56) References Cited

U.S. PATENT DOCUMENTS

| | | | | |
|---|---|---|---|---|
| 5,228,923 A | * | 7/1993 | Hed | ............ 136/208 |
| 5,968,456 A | * | 10/1999 | Parise | ............ 422/174 |
| 7,150,147 B2 | * | 12/2006 | Murata | ............ 60/287 |

FOREIGN PATENT DOCUMENTS

| | | |
|---|---|---|
| CH | 74178 | 6/1917 |
| DE | 100 41 955 A1 | 3/2002 |
| JP | 4-131528 | 12/1992 |
| JP | 11-055973 | 2/1999 |
| JP | 11-274575 | 10/1999 |
| JP | 2000-297632 | 10/2000 |

OTHER PUBLICATIONS

Machine translation of the JP document 11-055973 split into three parts.*
German Office Action issued Oct. 10, 2006 in 102005005078.6-34, with English translation.

* cited by examiner

*Primary Examiner*—Arun S. Phasge
(74) *Attorney, Agent, or Firm*—Kenyon & Kenyon LLP

(57) ABSTRACT

A thermoelectric generator that reduces the size of an entire exhaust apparatus for an internal combustion engine, while ensuring the amount of electric power generated by a thermoelectric generation element and the purging effect of a catalyst device. The thermoelectric generator includes a catalyst device, arranged in the exhaust passage, for purging exhaust. A thermoelectric generation element, which is arranged on the catalyst device, converts thermal energy of the exhaust passing through the exhaust passage to electric energy. The thermoelectric generation element is arranged at a downstream portion of the catalyst device with respect to the flow of the exhaust.

3 Claims, 4 Drawing Sheets

THERMOELECTRIC GENERATOR FOR INTERNAL COMBUSTION ENGINE

BACKGROUND OF THE INVENTION

The present invention relates to a thermoelectric generator, and more particularly, to a thermoelectric generator for converting thermal energy of exhaust from an internal combustion engine to electric energy.

The generation of electric power using a thermoelectric generation element, which converts thermal energy to electric energy, is known in the prior art. The thermoelectric generation element takes use of the Seeback effect in which the temperature difference between two ends (high temperature portion and low temperature portion) of a metal or semiconductor piece generates a potential difference between the high temperature and low temperature portions of the metal or semiconductor piece. A larger temperature difference increases the electric power generated by the thermoelectric generation element.

FIG. 1 shows an example of the structure of a thermoelectric generation element. As shown in FIG. 1, the thermoelectric generation element includes n-type and p-type semiconductors. Each n-type semiconductor has a high temperature portion, which functions as a positive pole, and a low temperature portion, which functions as a negative pole. To generate a large amount of electric power, the n-type and p-type semiconductors are alternately connected in series to form an electrode module.

Japanese Laid-Open Patent Publication No. 2000-297632 describes an example of an application of such a thermoelectric generation element. More specifically, a catalyst device (device including a carrier carrying a catalyst for purging exhaust) is arranged in an exhaust passage for an internal combustion engine. A thermoelectric generator is arranged upstream from the catalyst device to convert the thermal energy of exhaust to electric energy. However, the thermoelectric generator absorbs heat from the exhaust. This hinders with the heating of the catalyst device and prolongs the inactive period of the catalyst. To prevent such a problem, the thermoelectric generator functions as a heater that heats the exhaust with electric power when the catalyst is inactive in Japanese Laid-Open Patent Publication No. 2000-297632.

However, when the thermoelectric generation functions as a heater, the thermal energy of the exhaust is not converted to electric energy. This reduces the amount of generated power. To cope with this problem, a further thermoelectric generator is arranged downstream from the catalyst device in Japanese Laid-Open Patent Publication No. 2000-297632. The further thermoelectric generator is constantly used to generate power. However, such a structure enlarges the entire exhaust apparatus.

SUMMARY OF THE INVENTION

The present invention provides a thermoelectric generator that reduces the size of an exhaust apparatus for an internal combustion engine while ensuring the power generation amount of a thermoelectric generation element and the purging effect of a catalyst device.

One aspect of the present invention is a thermoelectric generator for use with an internal combustion engine connected to an exhaust passage. The generator includes a catalyst device, arranged in the exhaust passage, for purging exhaust. A thermoelectric generation element, arranged on the catalyst device, converts thermal energy of the exhaust passing through the exhaust passage to electric energy. The thermoelectric generation element is arranged in at least a downstream portion of the catalyst device with respect to the flow of the exhaust.

Another aspect of the present invention is a thermoelectric generator for use with an internal combustion engine connected to an exhaust passage. The generator has a catalyst device arranged in the exhaust passage and including a first portion, in which the temperature is relatively high when exhaust flows through the catalyst device, and a second portion, in which the temperature is relatively low when the exhaust flows through the catalyst device. A thermoelectric generation element, arranged on the catalyst device, for converting thermal energy of the exhaust passing through the exhaust passage to electric energy. The thermoelectric generation element is arranged on the first portion.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
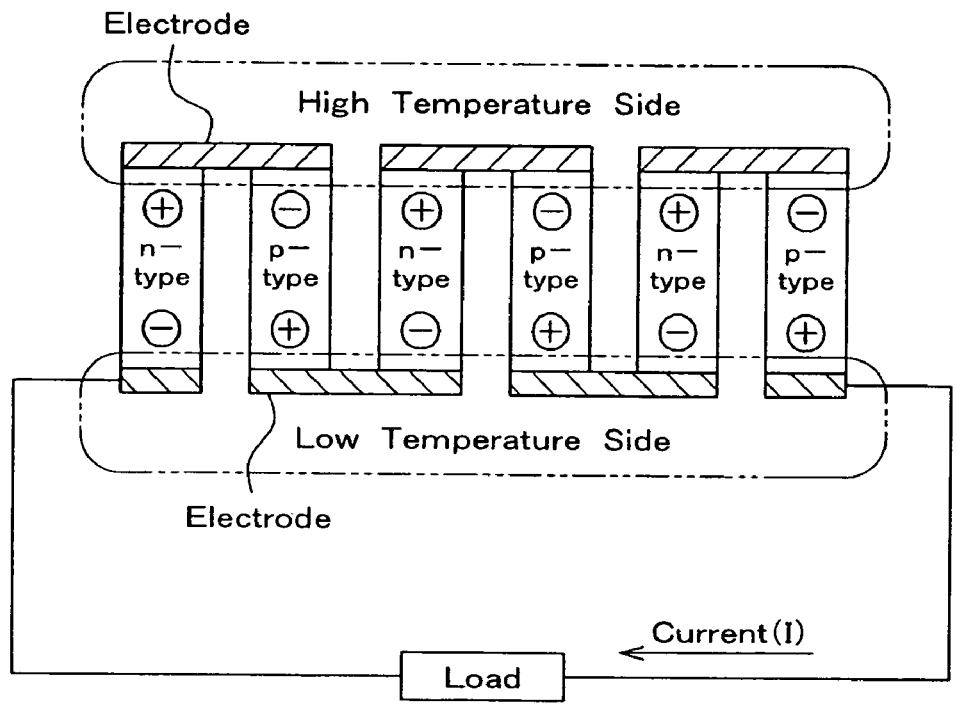
FIG. 1 is a schematic diagram showing the structure of a thermoelectric generation element.

In the drawings, like numerals are used for like elements throughout.

A thermoelectric generator 20 according to a preferred embodiment of the present invention will now be discussed with reference to FIGS. 2 to 5.

Figure 2:
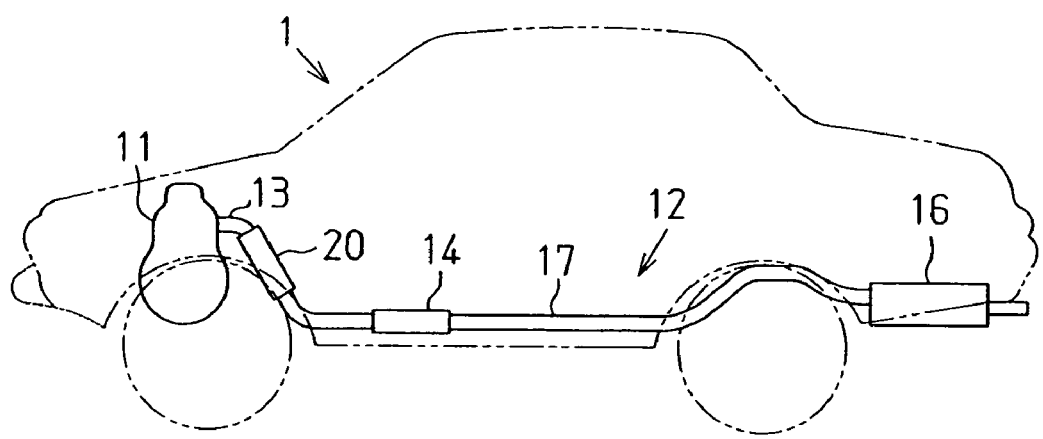
FIG. 2 is a schematic diagram showing an exhaust system of a vehicle incorporating a thermoelectric generator according to a preferred embodiment of the present invention.

FIG. 2 schematically shows an exhaust system 12 of a vehicle 1 incorporating the thermoelectric generator 20.

As shown in FIG. 2, the exhaust system 12 includes an exhaust passage 17. From the upstream side with respect to the flow of exhaust, the exhaust passage 17 includes an exhaust manifold 13, a thermoelectric generator 20, a second catalyst device 14, and a muffler 16. In the exhaust system 12, the exhaust emitted from an internal combustion engine 11 passes through the exhaust manifold 13, the thermoelectric generator 20, and the muffler 16 to be discharged into the atmosphere.

The thermoelectric generator 20 will now be discussed with reference to FIGS. 3 to 5.

Figure 3:
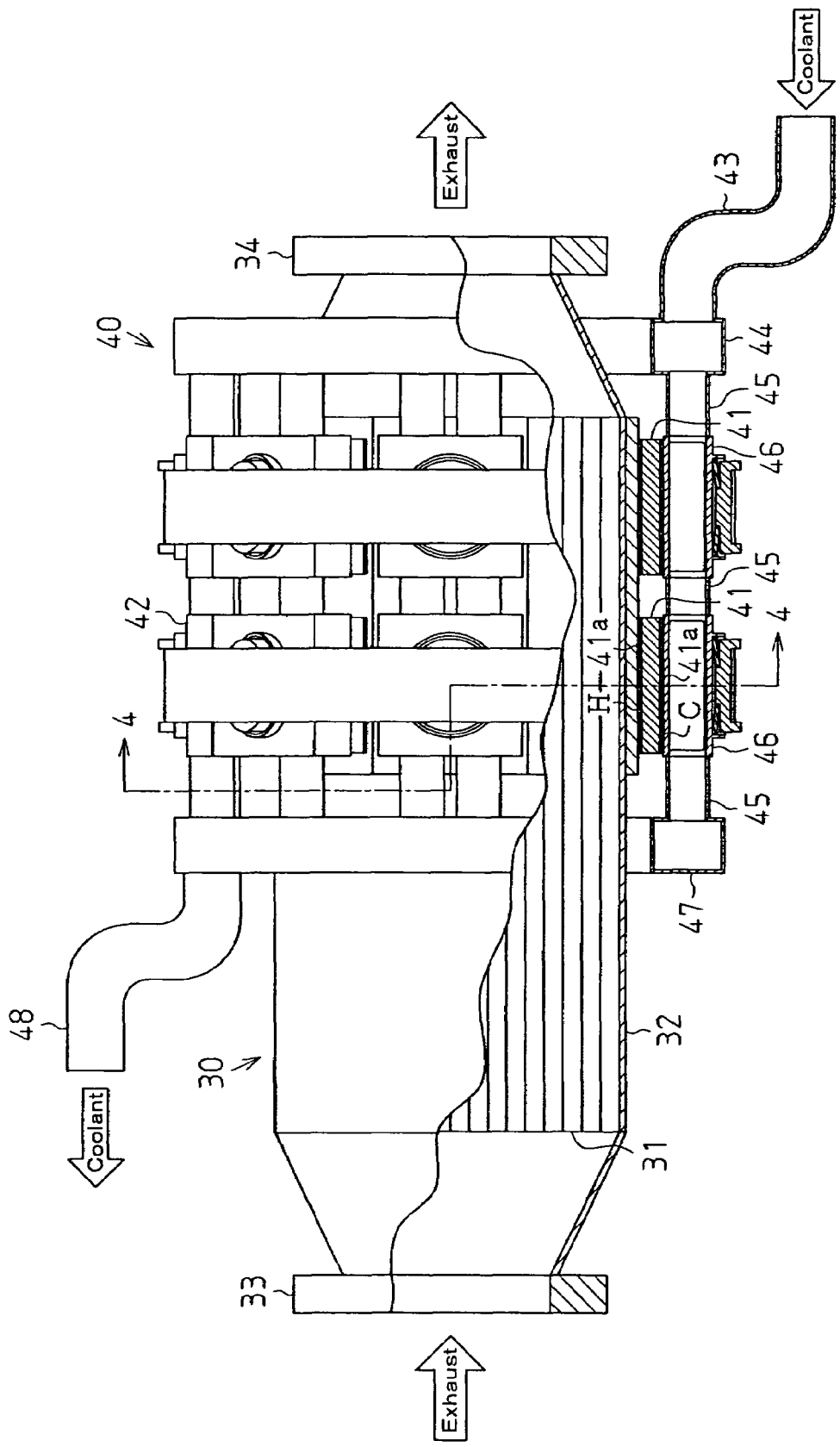
FIG. 3 is a partial cross-sectional diagram showing the thermoelectric generator of FIG. 2.

FIG. 3 is a partial cross-sectional view showing the thermoelectric generator 20. As shown in FIG. 3, the thermoelectric generator 20 includes a first catalyst device 30 and a thermoelectric generator stack 40.

The first catalyst device 30 includes a cylindrical catalyst carrier 31 and a casing 32 accommodating the catalyst carrier 31. The catalyst carrier 31 carries a catalyst. When the catalyst reaches a predetermined activation temperature, the catalyst purges exhaust components, such as, hydrocarbon (HC), carbon monoxide (CO), and nitrogen oxides (NOx). In comparison with the second catalyst device 14, the first catalyst device 30 carries a larger catalyst and has a higher exhaust purging capacity. The casing 32 is made of a material having a relatively high thermal conductivity and a relatively superior anti-corrosion property (e.g., stainless steel). The casing 32 has open ends. An upstream flange 33 connected to the exhaust manifold 13 is arranged on one end of the casing 32. A downstream flange 34 connected to the exhaust passage 17 is arranged on the other end of the casing 32.

The thermoelectric generation stack 40 includes a plurality of thermoelectric generation elements 41 and a cooling mechanism 42. Each thermoelectric generation element 41 has the same structure as the thermoelectric generation element shown in FIG. 1. Each thermoelectric generation element 41 has an electrode arranged on each of two opposite surfaces. An insulation layer 41a, which has high thermal conductivity, is applied to each of the two electrodes. The thermoelectric generation elements 41 are arranged on the peripheral surface of the first catalyst device 30 along the axial direction of the first catalyst device 30, or the flow direction of the exhaust. The surface of each thermoelectric generation element 41 facing towards the first catalyst device 30 (hereafter referred to as surface H) is a high temperature surface.

The cooling mechanism 42 is arranged on the surface of each thermoelectric generation element 41 that is opposite the surface H. Coolant, which is a cooling medium, is drawn into the cooling mechanism 42. From the upstream side with respect to the flow direction of the coolant, the cooling mechanism 42 includes an intake pipe 43, a first collection portion 44, distribution pipes 45, cooling portions 46, a second collection portion 47, and a discharge pipe 48.

The first collection portion 44 and the second collection portion 47 are annular pipes that are arranged outside the peripheral surface of the casing 32. The second collection portion 47 is arranged upstream from the first collection portion 44 with respect to the exhaust flow direction. The distribution pipes 45, which extend in the axial direction of the first catalyst device 30, connect the first collection portion 44 and the second collection portion 47.

Each distribution pipe 45 includes the cooling portions 46, which cool the associated thermoelectric generation elements 41. The surface of each thermoelectric generation element 41 contacting the associated cooling portion 46 (hereafter referred to as surface C) is a low temperature surface. Coolant is drawn into each cooling portion 46 through the associated distribution pipe 45.

The intake pipe 43 is connected to the first collection portion 44. Coolant is drawn into the first collection portion 44 through the intake pipe 43. The discharge pipe 48 is connected to the second collection portion 47. Coolant is discharged into a cooling system from the second collection portion 47 through the discharge pipe 48.

The thermoelectric generation elements 41, or the thermoelectric generation stack 40, are arranged on the peripheral surface of the first catalyst device 30 at the downstream side with respect to the exhaust flow direction.

Figure 4:
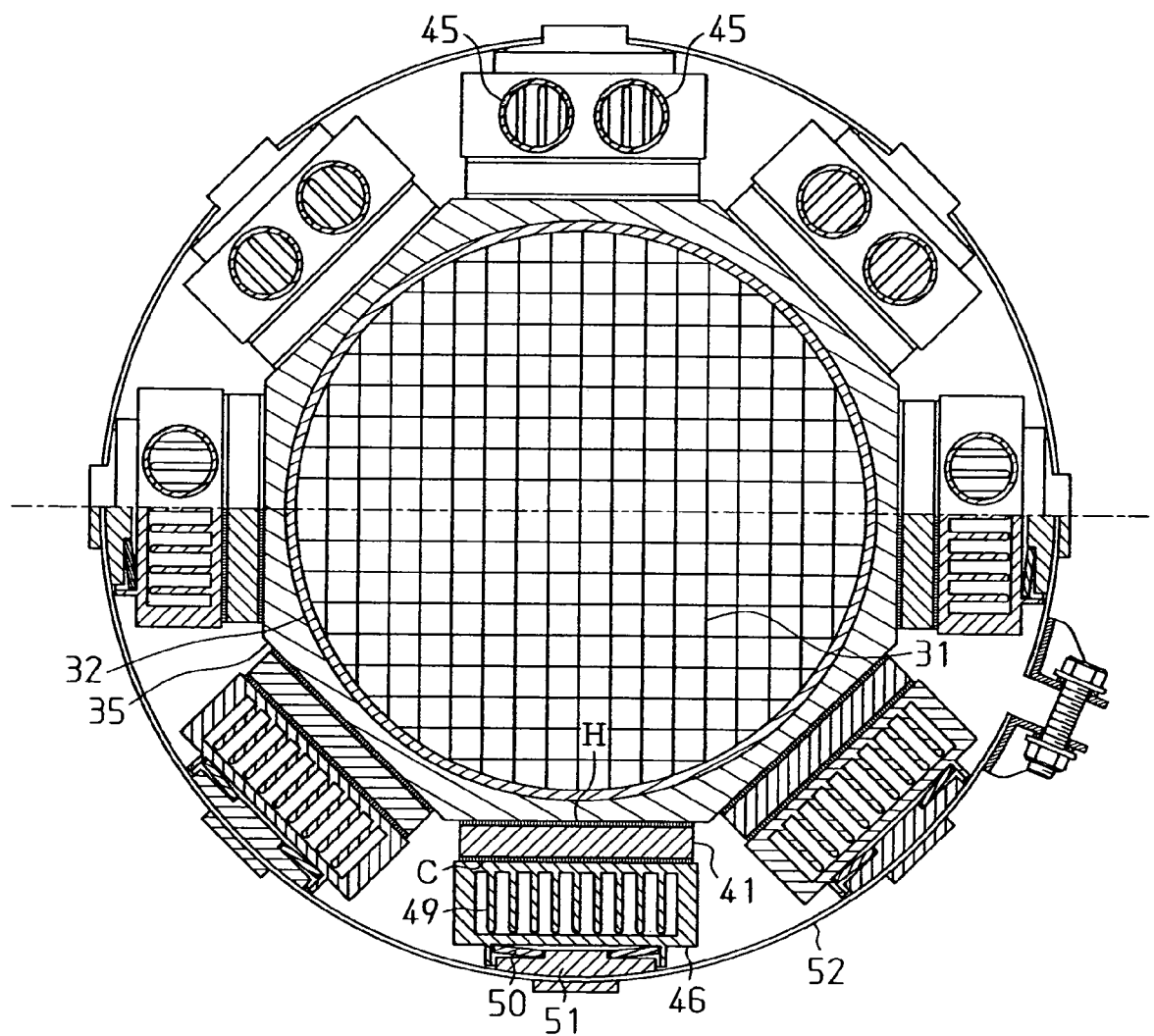
FIG. 4 is a cross-sectional view taken along line 4-4 in FIG. 3.
Figure 5:
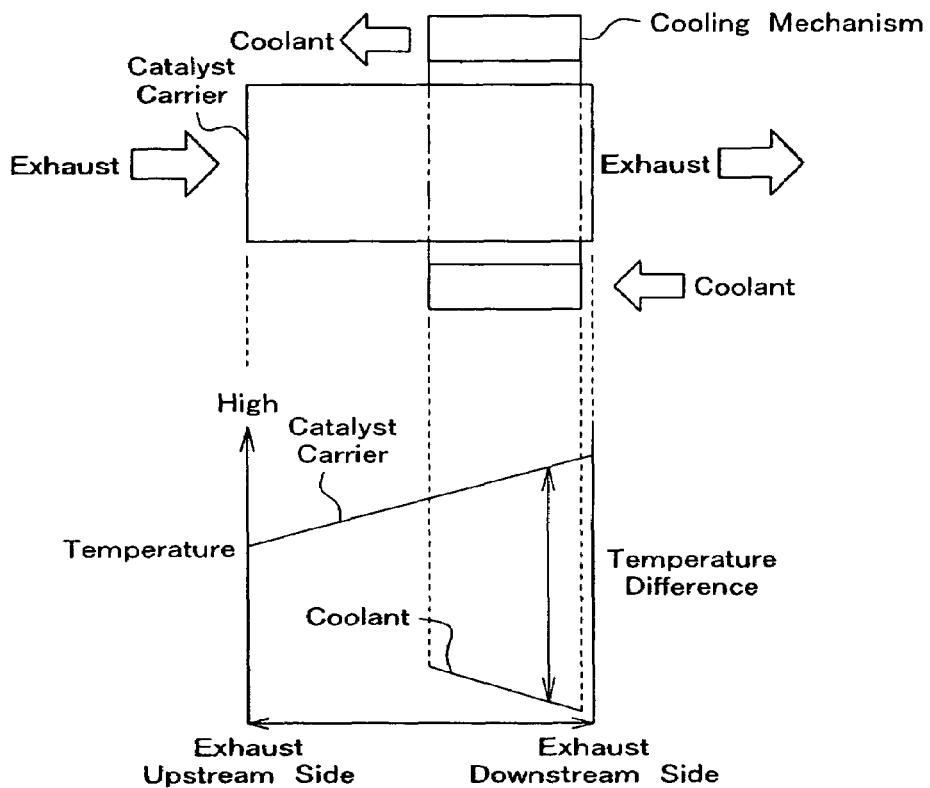
FIG. 5 is a diagram showing temperature distribution in a catalyst carrier and a coolant.
Figure 6:
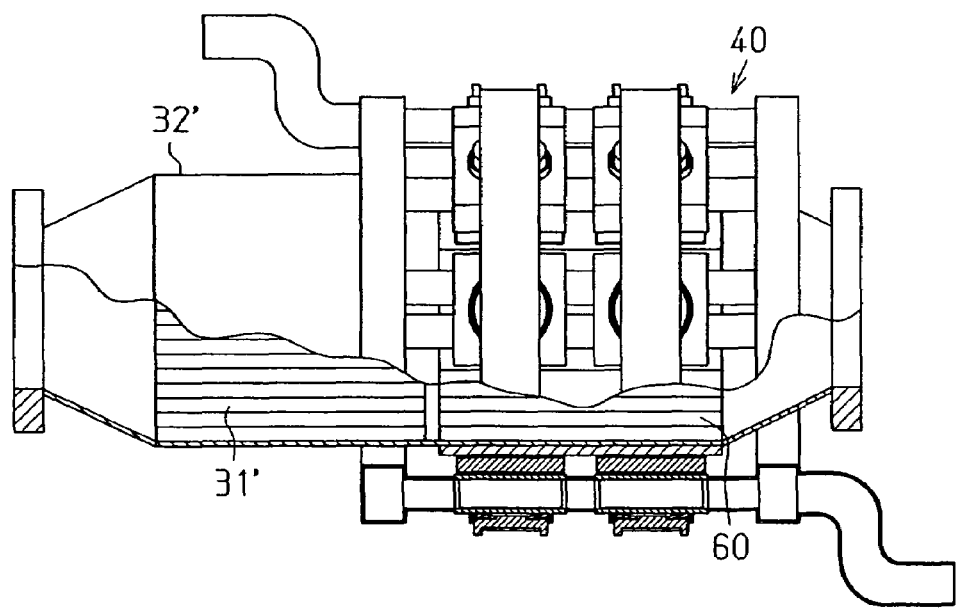
FIG. 6 is a partial cross-sectional diagram showing a thermoelectric generator according to a further embodiment of the present invention.

FIG. 4 is a cross-sectional view taken along line 4-4 in FIG. 3. As shown in FIG. 4, the catalyst carrier 31 is inserted in the casing 32. The casing 32 is inserted in a octagonal sleeve 35. The sleeve 35 is made of a material having high thermal conductivity, such as aluminum or copper. The sleeve 35 has a peripheral surface including eight flat planes extending in the longitudinal direction of the casing 32.

The thermoelectric generation elements 41 are arranged in contact with the peripheral surface of the sleeve 35. In the preferred embodiment, two thermoelectric generation elements 41 are arranged on each of the eight flat planes of the sleeve 35. Thus, a total of sixteen (8×2) thermoelectric generation elements 41 are arranged on the peripheral surface of the sleeve 35. Further, the thermoelectric generation elements 41 are arranged at equal angular intervals (45°).

In each thermoelectric generation element 41, the surface C is in contact with the associated cooling portion 46. Further, as shown in FIG. 4, a plurality of heat radiating fins 49 are formed in each cooling portion 46.

A Belleville spring 50 and a washer 51 are arranged on the surface of each cooling portion 46 opposite the surface contacting the associated thermoelectric generation element 41. A band 52 fixes each cooling portion 46 to the associated thermoelectric generation element 41 by means of the corresponding Belleville spring 50 and washer 51.

When the exhaust from the internal combustion engine 11 flows into the first catalyst device 30, the exhaust heats the first catalyst device 30, that is, enhance the activation of the catalyst carried by the catalyst carrier 31. When the temperature of the catalyst reaches a predetermined activation temperature, the catalyst purges the exhaust. Then, the purged exhaust flows into the exhaust passage 17.

The heat of the exhaust raises the temperature of the first catalyst device 30. Thus, in each thermoelectric generation element 41, the temperature of the surface H contacting the peripheral surface of the first catalyst device 30 becomes high. Conversely, in each thermoelectric generation element 41, coolant cools the surface C contacting the associated cooling portion 46. Thus, the temperature of the surface C becomes low. An increase in the temperature difference between the surface H and the surface C of each thermoelectric generation element 41 in this manner produces a potential difference in the thermoelectric generation element 41 and generates electric power.

Activation of the catalyst generates chemical reaction heat. Accordingly, the first catalyst device 30 receives the heat of the exhaust and the chemical reaction heat. This further raises the temperature of the first catalyst device 30. As a result, the temperature of the high temperature surface H in each thermoelectric generation element 41 is further increased. That is, the arrangement of the thermoelectric generation elements 41 on the first catalyst device 30 further increases the temperature difference between the high temperature surface H and the low temperature surface C of the thermoelectric generation element 41, which increases the amount of generated electric power.

The thermoelectric generation elements 41, or the thermoelectric generation stack 40, are arranged on the peripheral surface of the first catalyst device 30 at the downstream side with respect to the exhaust flow direction. Thus, at portions corresponding to the upstream side of the exhaust in the first catalyst device 30, the first catalyst device 30 does not hinder with the heating of the first catalyst device 30. Accordingly, the upstream side of the first catalyst device 30 with respect to the exhaust gas flow is sufficiently heated. This ensures sufficient heating of the first catalyst device 30.

In this manner, the thermoelectric generation elements 41 do not affect the temperature increase of the first catalyst device 30 in an undesirable manner. In the thermoelectric generation device of the prior art that is described above, the thermoelectric generation element may be used as a heater.

However, in the preferred embodiment, the thermoelectric generation elements 41 are constantly used to generate electric power. This ensures that the thermoelectric generation elements 41 generate a sufficient amount of electric power.

In the preferred embodiment, the thermoelectric generation element 41 (thermoelectric generation stack 40) is arranged on the peripheral surface of the first catalyst device 30. Thus, the first catalyst device 30 and the thermoelectric generation elements 41 are formed integrally. This reduces the size of the entire exhaust apparatus for the internal combustion engine in comparison to when arranging a catalyst device and a thermoelectric generator separately in the exhaust passage.

The cooling mechanism 42 is arranged on the surface C of each thermoelectric generation element 41. This increases the temperature difference between the high temperature surface H and the low temperature surface C of the thermoelectric generation element 41 and further increases the amount of electric power generated by the thermoelectric generation element 41.

As described above, chemical reaction heat is produced when the catalyst is activated. In such a state, the temperature distribution of the first catalyst device 30 (catalyst carrier 31) is not uniform. As shown in FIG. 5, the temperature of the first catalyst device 30 is higher toward the downstream side with respect to the flow of exhaust. The coolant absorbs heat from the first catalyst device 30 as it flows through the cooling mechanism 42. Thus, the temperature of the coolant is higher toward the downstream side with respect to the coolant flow. Thus, the temperature difference between the high temperature surface H and the low temperature surface C of each thermoelectric generation element 41 is greater when the coolant and exhaust flow in opposite directions and generate more electric power like in the preferred embodiment compared to when the coolant of the cooling mechanism 42 flows in the same direction as the exhaust.

The thermoelectric generator 20 of the preferred embodiment has the advantages described below.

(1) The thermoelectric generator 20 includes the first catalyst device 30 and the thermoelectric generation elements 41 that are arranged integrally with one another. Accordingly, the size of the entire exhaust apparatus for the internal combustion engine 11 is reduced in comparison to when separately arranging a catalyst device and a thermoelectric generator in the exhaust passage 17.

(2) Chemical reaction heat is produced when the catalyst is activated. Thus, the increase in the temperature of the first catalyst device 30 is greater than the temperature increase caused by the exhaust heat. Since each thermoelectric generation element 41 is arranged in such first catalyst device 30, the temperature of the high temperature surface H in each thermoelectric generation element 41 is further increased. This increases the temperature difference between the high temperature surface H and the low temperature surface C and thus further increases the amount of electric power generated by the thermoelectric generation element 41.

(3) Each thermoelectric generation element 41 is arranged on the peripheral surface of the first catalyst device 30 at the downstream side with respect to the exhaust flow direction. Thus, the upstream side of the first catalyst device 30 is heated in an optimal manner. This ensures the purging effect of the first catalyst device 30.

(4) The thermoelectric generation elements 41 do not affect the heating of the first catalyst device 30 in an undesirable manner. Thus, the thermoelectric generation elements 41 are constantly used to generate electric power. This ensures the amount of electric power generated by the thermoelectric generation elements 41 in an optimal manner.

(5) The cooling mechanism 42 is attached to the thermoelectric generation elements 41. This increases the temperature difference between the high temperature surface H and the low temperature surface C of each thermoelectric generation element 41. Thus, the amount of generated electric power is further increased.

(6) The coolant in the cooling mechanism 42 and the exhaust in the first catalyst device 30 flow in opposite directions. This further increases the temperature difference between the high temperature surface H and the low temperature surface C of each thermoelectric generation element 41 and thus further increases the amount of generated electric power.

It should be apparent to those skilled in the art that the present invention may be embodied in many other specific forms without departing from the spirit or scope of the invention. Particularly, it should be understood that the present invention may be embodied in the following forms.

In the preferred embodiment, the first catalyst device 30 is arranged in the thermoelectric generator 20, and the second catalyst device 14 is arranged downstream from the thermoelectric generator 20. Instead, from the upstream side with respect to the flow direction of exhaust, in a casing 32', which is similar to the casing 32, a catalyst carrier 31', which is similar to the catalyst carrier 31, and a second catalyst carrier 60, which is similar to the catalyst carrier of the second catalyst device 14, may be arranged. Further, the thermoelectric generation stack 40 may be arranged on the peripheral surface of the second catalyst carrier 60. Alternatively, the catalyst carrier 31 of the preferred embodiment may be divided into an upstream carrier and a downstream carrier, with the thermoelectric generation stack 40 arranged around the downstream carrier.

In the preferred embodiment, the cooling mechanism 42 may be eliminated. In this case, the surface C of each thermoelectric generation element 41 is exposed to the atmosphere and cooled. In this case, the thermoelectric generator still has the above advantages (1) to (4).

In the preferred embodiment, the thermoelectric generation elements 41 are arranged only at portions of the first catalyst device 30 corresponding to the downstream side with respect to the exhaust flow. Instead, the thermoelectric generation elements 41 may be arranged with a low density at portions of the first catalyst device 30 corresponding to the upstream side with respect to the exhaust flow and arranged with a high density at portions of the first catalyst device 30 corresponding to the downstream side with respect to the exhaust flow. In other words, more thermoelectric generation elements 41 may be arranged at the upstream side of the first catalyst device 30 than the downstream side. In this case, the thermoelectric generator has the same advantages as the preferred embodiment.

In the preferred embodiment, the band 52 fastens together the first catalyst device 30 and the thermoelectric generation stack 40. However, the first catalyst device 30 and the thermoelectric generation stack 40 may be fastened by any means. Further, there may be any quantity of the thermoelectric generation elements 41.

In the preferred embodiment, coolant is used as the cooling medium of the cooling mechanism 42. However, any cooling medium may be used as long as the cooling mechanism 42 can be cooled.

The present examples and embodiments are to be considered as illustrative and not restrictive, and the invention is not to be limited to the details given herein, but may be modified within the scope and equivalence of the appended claims.

What is claimed is:

1. A thermoelectric generator for use with an internal combustion engine connected to an exhaust passage, the generator comprising:
   a catalyst device, arranged in the exhaust passage, for purging exhaust; and
   a first and second plurality of thermoelectric generation elements, arranged on the catalyst device, for converting thermal energy of the exhaust passing through the exhaust passage to electric energy, the first plurality of thermoelectric generation elements being arranged with a low density in a upstream portion of the catalyst device with respect to the flow of the exhaust, and the second plurality of thermoelectric generation elements being arranged with a high density in a downstream portion of the catalyst device with respect to the flow of the exhaust,
   wherein each of the first and second plurality of thermoelectric generation elements includes a first surface facing toward the catalyst device and a second surface opposite the first surface, the generator further comprising a cooling mechanism arranged in direct contact with the second surface for cooling the first and second plurality of thermoelectric generation elements with a cooling medium; and
   wherein all of the thermoelectric generation elements in the first and second plurality of thermoelectric generation elements have substantially the same size.

2. The generator according to claim 1, wherein the cooling medium flows through the cooling mechanism in a direction opposite the direction in which the exhaust flows through the catalyst device.

3. A thermoelectric generator for use with an internal combustion engine connected to an exhaust passage, the generator comprising:
   a catalyst device, arranged in the exhaust passage, for purging exhaust, the catalyst device having a first upstream peripheral surface portion and a second downstream peripheral surface portion with respect to the flow of the exhaust; and
   a thermoelectric generation element, arranged on the catalyst device, for converting thermal energy of the exhaust passing through the exhaust passage to electric energy, wherein the thermoelectric generation element is arranged on a substantial surface of the second downstream peripheral surface portion but not on the first upstream peripheral surface portion.

\* \* \* \* \*